(12) United States Patent
Leuten (10) Patent No.: US 11,646,253 B2
(45) Date of Patent: May 9, 2023

(54) BALL INTERCONNECT STRUCTURES FOR SURFACE MOUNT COMPONENTS

(71) Applicant: Intel Corporation, Santa Clara, CA (US)

(72) Inventor: Tyler Leuten, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 928 days.

(21) Appl. No.: 15/943,391

(22) Filed: Apr. 2, 2018

(65) Prior Publication Data

US 2019/0304886 A1  Oct. 3, 2019

(51) Int. Cl.
*H01L 23/498* (2006.01)
*H01L 23/00* (2006.01)
*H05K 1/11* (2006.01)

(52) U.S. Cl.
CPC ........ *H01L 23/49816* (2013.01); *H01L 24/48* (2013.01); *H05K 1/111* (2013.01); *H01L 2924/01079* (2013.01)

(58) Field of Classification Search
CPC .... H01L 23/49816; H01L 24/48; H05K 1/111
See application file for complete search history.

(56) References Cited

U.S. PATENT DOCUMENTS

| | | | | |
|---|---|---|---|---|
| 6,163,456 | A * | 12/2000 | Suzuki | H05K 1/141 361/704 |
| 8,710,657 | B2 * | 4/2014 | Park | H01L 23/3128 257/E23.021 |
| 2002/0037363 | A1 * | 3/2002 | Baba | H05K 3/0091 427/10 |
| 2008/0050905 | A1 * | 2/2008 | Uchida | H01L 24/03 257/E21.508 |
| 2008/0150096 | A1 * | 6/2008 | Ishio | H01L 23/5389 257/659 |
| 2010/0052132 | A1 * | 3/2010 | Baek | H01L 25/105 257/686 |
| 2016/0218092 | A1 * | 7/2016 | Chang | H01L 23/528 |

* cited by examiner

*Primary Examiner* — Dale E Page
*Assistant Examiner* — Quovaunda Jefferson
(74) *Attorney, Agent, or Firm* — Essential Patents Group, LLP.

(57) ABSTRACT

Embodiments include a microelectronic package structure having a substrate with one or more substrate pads on a first side of the package substrate. A ball interconnect structure is on the substrate pad, the ball interconnect structure comprising at least 99.0 percent gold. A discrete component having two or more component terminals is on the ball interconnect structure.

20 Claims, 10 Drawing Sheets

BALL INTERCONNECT STRUCTURES FOR SURFACE MOUNT COMPONENTS

TECHNICAL FIELD

Embodiments of the present description generally relate to the field of microelectronic packaging, and, more particularly, to microelectronic packages having at least one ball interconnect structure comprising gold.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like.

One way to achieve these goals is by increasing integration density, such as by decreasing component to component spacing on packaging substrates. The components may include discrete components, in some cases, and may be adjacent to integrated devices, such as integrated circuit devices, on the substrate. For example, microelectronic package structures, such as system in package (SIP) structures, require ever decreasing spacing between such components.

During fabrication, temperature processing, such as solder reflow processing, can induce solder migration which can in turn lead to solder shorts between the components, which may include surface mount components. In order to mitigate such solder shorting, board layout rules, such as printed circuit board layout rules, have been adapted to accommodate the solder migration. As a result, the component to component spacing on a board may be much larger than the capability of the spacing of component placement tools.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures are absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, the front-side may be referred to as the "active surface" of the die. A number of interconnects may extend from the die's front-side to an underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate.

Described herein are microelectronic packaging structures having ball interconnect structures between discrete components and a substrate, and methods of fabricating such microelectronic packaging structures. The ball interconnect structures are between substrate pads of a substrate, such as a package substrate, for example, and the terminals of one or more discrete components. The discrete component may be a surface mount component in some embodiments. The discrete component may have at least two component terminals that may be coupled to a substrate. The discrete component is a component/device that is mounted directly onto a substrate surface, such as onto a surface of a printed circuit board, for example. The discrete components described herein may comprise such passive components as inductors, resistors, and capacitors, for example, as well as discrete transistor devices.

The discrete components may be located in a peripheral portion of a substrate, and a die may be located in a central portion of the substrate, in some embodiments. At least one ball interconnect structure is between the discrete component terminals and the conductive substrate pads. The substrate pads and the ball interconnect structures are at least 99.0 percent gold, in some embodiments. The ball interconnect structures are within a footprint of the solder pads. The ball interconnect structures described herein enable increased component density on substrates, such as on system in package substrates, since the ball interconnect structures do not significantly migrate beyond the solder pad footprint during temperature processing.

Some embodiments include a substrate pad on a substrate, where the substrate pad is on a first side of the substrate. A ball interconnect structure is on the substrate pad. In some embodiments, the ball interconnect structure and the substrate pad comprise at least 99 percent gold. A discrete component, such as a surface mount component, may comprise two or more terminals. A terminal of the discrete component may be on the ball interconnect structure, such that the ball interconnect structure is between the substrate pad and the discrete component terminal. The discrete component may be located in a peripheral portion of the substrate, and a die may be on a central portion of the substrate, in some embodiments.

Figure 1A:
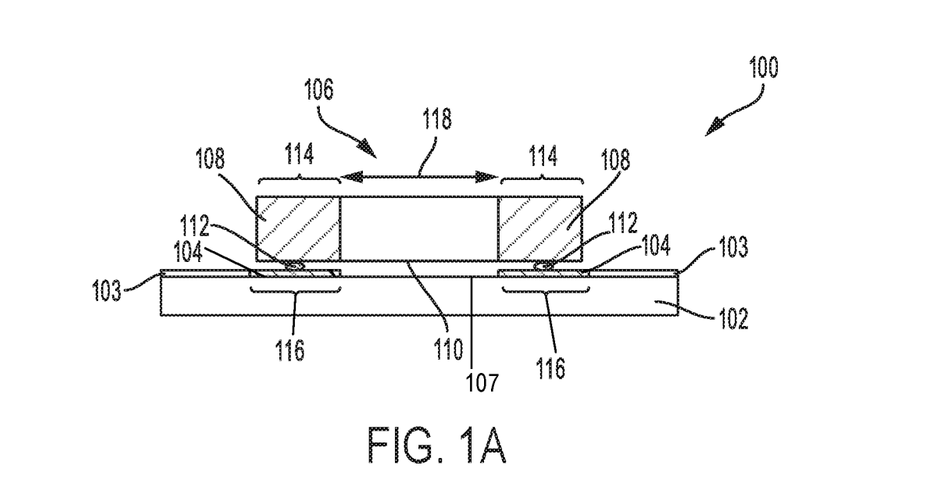
FIG. 1A illustrates a cross-sectional view of a package structure with ball interconnect structures, according to embodiments.

FIG. 1A is a cross-sectional view of a package structure 100, arranged in accordance with some embodiments of the present disclosure. The package structure 100 includes a discrete component 106 coupled to a first side 107 of a portion of a substrate 102. The substrate 102 may comprise a system in package substrate, a printed circuit board, or any other suitable substrate according to a particular application. The substrate 102 may include such materials as phenolic cotton paper (e.g., FR-1), cotton paper and epoxy materials (e.g., FR-3), woven glass materials that are laminated together using an epoxy resin (e.g., FR-4), glass/paper with epoxy resin (e.g., CEM-1), glass composite with epoxy resin, woven glass cloth with polytetrafluoroethylene (e.g., PTFE CCL), or other polytetrafluoroethylene based prepreg material.

The substrate 102 may include conductive interconnect structures/routing layers (not shown) that are within dielectric layer(s), which may be configured to route electrical signals between any number of discrete components 106 and/or die/devices (not shown). For example, in some embodiments, interconnect structures may include routing structures such as pads or traces configured to receive electrical signals to and from devices. In some embodiments, individual ones of the conductive interconnect structures/layers comprise trenches, ground planes, power planes, re-distribution layers (RDLs), and/or any other appropriate electrical routing features. In some embodiments, the routing layers 106 may comprise conductive materials such as copper, gold and nickel. The dielectric layers and the conductive layers/structures of the substrate 102 are sometimes referred to as a "package substrate." The substrate 102 may also provide structural support for the discrete components 106 and/or devices.

In some embodiments, the substrate 102 may comprise a multi-layer substrate—including alternating layers of a dielectric material and metal—built-up around a core layer (either a dielectric or metal core). In some embodiments, the substrate 102 may comprise a coreless multi-layer substrate. Other types of substrates and substrate materials may also find use with the disclosed embodiments (e.g., ceramics, sapphire, glass, etc.). The substrate 102 may be any substrate known to be suitable for one or more of flip-chip packages (FCBGA), package-on-package (PoP), system-in-package (SiP), or the like. The substrate 102 may further include interconnect structures (not shown) such as solder balls, on a second side, opposite the first side 101 of the substrate 102, which may couple the package structure 100 to a motherboard, or any other suitable type of board, for example.

The substrate 102 may include any number of discrete components 106 coupled to the first side 107, but one component 106 is shown in FIG. 1A for simplicity. The discrete component 106 may comprise a surface mount component 106, in some embodiments, and may comprise a resistor, inductor, capacitor or a discrete transistor, in some embodiments. The discrete component 106 is shown as having two terminals 108, however in some embodiments the discrete component 106 may comprise greater than two terminals, such as 4, 8, or more terminals. The terminals 108 may comprise any suitable shape/geometry, and are not limited to a rectangular shape. The terminals 108 may comprise conductive materials, such as, but not limited to, copper, gold or nickel, in some embodiments.

The discrete component 106 includes a component body 110 between the terminals 108. The component body 110 may comprise such materials as resistor materials, such as but not limited carbon, silicon, oxides of silicon, metals and oxides of metals, in some embodiments. The component body 110 may comprise to inductive materials, such as, but not limited to, ferromagnetic materials, conductive materials, such as copper for example, and dielectric materials, such as silicon dioxide, in some embodiments. The component body 110 may comprise a dielectric material, and may comprise a portion of a capacitor, in some embodiments. In other embodiments, the component body 110 may comprise a portion of a discrete transistor, such as a discrete bipolar or a discrete field effect transistor (FET), and may include conductive materials, silicon and oxides of silicon. The component body 110 may comprise a lateral width 118.

The substrate 102 may comprise one or more substrate pads 104 that are on the first surface of the substrate 102. The substrate pads 104 are coupled with individual ones of the terminals 108. The substrate pads 104 comprise a gold material, and may comprise greater than 99.0 percent gold, in some embodiments. In some embodiments, the substrate pads 104 may comprise an alloy of gold. In some embodiments, the substrate pads 104 may comprise a filler material, such as silicon and/or beryllium. The substrate pads 104 may comprise any suitable geometry, and may be tailored to accommodate the geometry and numbers of terminals for a given discrete component terminal geometry. In an embodiment, individual component terminals 108 have a footprint 114. A solder mask 103 may be on the first surface of the substrate 102, adjacent the substrate pads 104 and adjacent peripheral edges of the component 106, in some embodiments. There is a gap/space between the component body 110 and the substrate 102.

In some embodiments, a footprint 116 of an individual substrate pad 104 is within the footprint 114 of an individual one of the discrete component terminal 108. In other embodiments, the footprint 116 of the individual substrate pad 104 is within about 10 percent of the footprint 114 of the discrete component terminal 108. In some embodiments, the lateral width 118 of the component body 110 does not overlay the substrate pad footprint 114.

In an embodiment, a ball interconnect structure 112 is between the substrate pad 104 and the component terminal 108. At least one ball interconnect structure 112 is between each individual component terminal 108. For example, a four terminal discrete component 106 may have a ball interconnect structure 112 on each of the four terminals 108. Each of the four ball interconnect structures 112 may be on a solder pad 104. The exact arrangement of the ball interconnect structure on the solder pads 104 may vary depending upon the particular geometry and number of the terminals 108.

In some embodiments, the ball interconnect structure 112 comprises at least 99.0 percent gold, and may additionally comprise filler materials, such as silicon and/or beryllium, for example. In some embodiments, the ball interconnect structure 112 may comprise a gold alloy. In some embodiments, the ball interconnect structure comprises a spherical shape. In some embodiments, the ball interconnect structure 112 is within the footprint 116 of the substrate pad 104, that is, the ball interconnect structure 112 does not extend beyond the footprint 116 of the substrate pad 104. In some embodiments, the ball interconnect structure 112 and/or the substrate pad 104 may comprise, 99.9 percent gold, 99.99, percent gold, or 99.999 percent gold, for example.

Figure 1B:
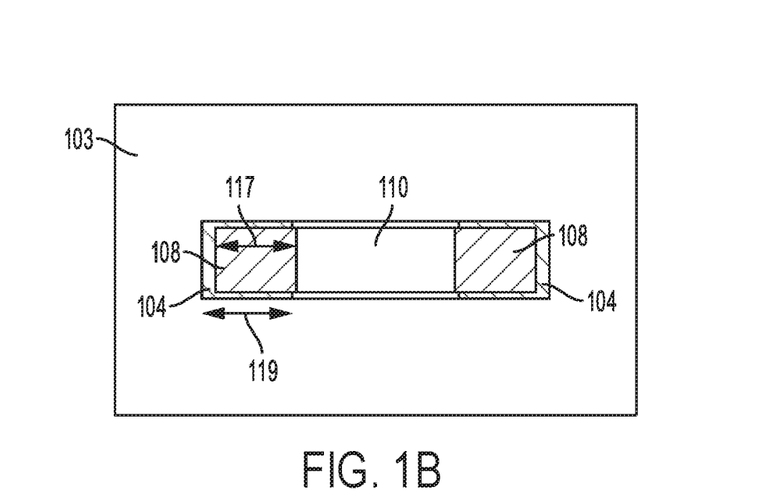
FIG. 1B illustrates a top view of a package structure with ball interconnect structures, according to embodiments.

FIG. 1B depicts a top view of the package structure 100. The solder mask 103, which may comprise any suitable solder material, may be adjacent the substrate pads 104. The component body 110 footprint does not overlap the foot print of the component terminals 108, in some embodiments. A lateral width 119 of the substrate pads 104 is greater than the lateral width 117 of the component terminal 108, but the lateral width 119 of the substrate pad 104 does not extend into the footprint of the component body 110. The footprint 116 of the substrate pad 104 (nor the ball interconnect structure) does not extend appreciably (does not extend greater than 10 percent) past the footprint 114 of the component terminal 108, including during thermal processing. Substrate real estate is thus preserved since the substrate pad 104 and ball interconnect structure 112 do not migrate significantly during thermal processing, due to the relatively high concentration of gold.

Figure 2:
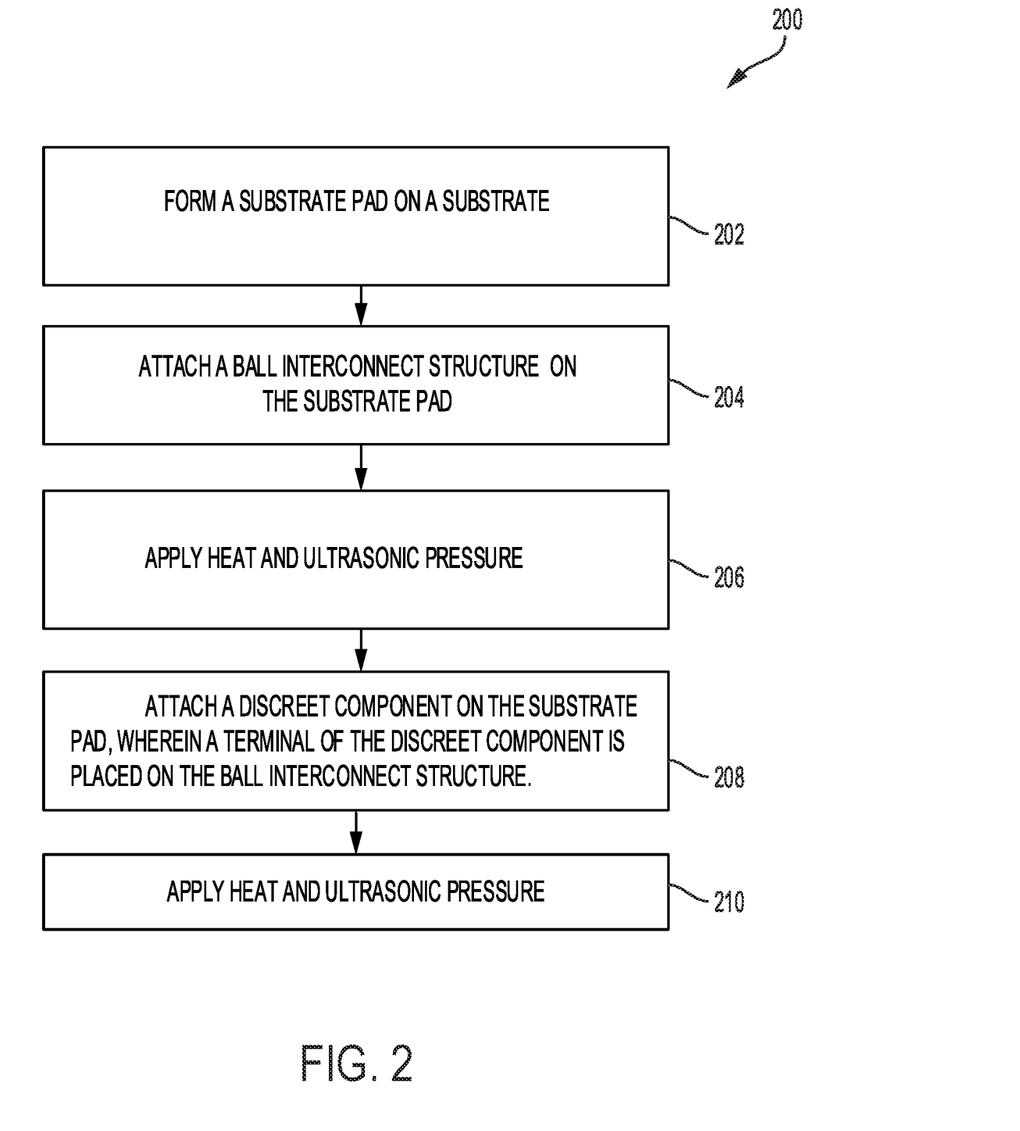
FIG. 2 is a flow diagram illustrating a method of fabricating package structures with ball interconnect structures, according to embodiments.

FIG. 2 depicts a flow chart of methods of forming one or more discrete components on a substrate, wherein ball interconnect structures are between discrete component terminals and substrate pads on the substrate, according to embodiments.

At operation 202, one or more substrate pads may be formed on a substrate. The substrate may comprise a system in package substrate in some embodiments, and in other embodiments may comprise an interposer. The substrate pads may be formed by utilizing a gold deposition process, such as, but not limited to, a gold plating or a gold physical deposition process, such as a gold sputtering process, for example. The substrate pads may comprise greater than 99.90 percent gold, in an embodiment. In some embodiments, the substrate pads may additionally comprise filler materials, such as silicon and/or beryllium, for example. The substrate pads may comprise a thickness of between about 5 microns and 20 microns, in some embodiments. The substrate pads may be formed in a peripheral portion of the substrate in some embodiments, but in other embodiments may be formed in any suitable location on the substrate. The substrate pads may comprise any suitable size or geometry, depending upon the particular application, and may be configured to accommodate component terminals of discrete components to be subsequently placed on the substrate pads.

At operation 204, a ball interconnect structure may be attached on the substrate. The ball interconnect structure may be placed/formed on the substrate by using a wire bonding process. The wire bonding process may include utilizing a wire bonding machine to form wire bonds onto the substrate pads. The wire bonds may comprise greater than 99.90 percent gold, in an embodiment. In some embodiments, the wire bonds may additionally comprise filler materials, such as silicon and/or beryllium, for example. At step 206, the gold wire bonds may be attached to the substrate by using heat and ultrasonic pressure, in some embodiments. In some embodiments, the wire bonding process may comprise a room temperature process, in other embodiments, the temperature may comprise between 120 degrees Celsius and 500 degrees Celsius. In some embodiments, any number of gold wire bonds may be placed on individual substrate pads, depending upon the number of terminals, geometry, etc. of the discrete component to be attached to the substrate pad. The gold wire bonds form ball interconnect structures after ultrasonic and heat processing. In some embodiments, individual ball interconnect structures may comprise a diameter of between about 20 microns to about 100 microns.

At step 208, a discrete component may be attached to the substrate pad, wherein component terminals of the discrete component are placed on at least one ball interconnect structure. The discrete component may comprise any discrete, non-integrated, passive or active component, such as a resistor, capacitor, inductor, discrete transistor, or other small, discrete, chip scale packages, in some embodiments. In some embodiments, the discrete components comprise surface mount components. The discrete component may comprise any number of component terminals, and each component terminal may be placed on at least one ball interconnect structure. In some embodiments, the discrete component may be attached to the ball applying heat and ultrasonic pressure (step 210). The attachment of the discrete component structures onto the ball interconnect structures requires no additional cleaning processes, in some embodiments. In some embodiments, a die/device (not shown) may be attached to the substrate 102, adjacent the discrete component.

Figure 3A:
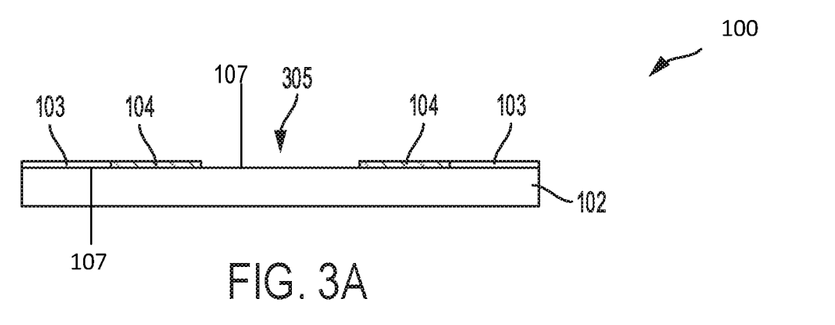
FIGS. 3A-3F illustrate cross-sectional views of package structures with ball interconnect structures, according to embodiments.

FIGS. 3A-3F depict cross-sectional views of structures formed by employing a process of fabricating the discrete components comprising at least one ball interconnect structure. In FIG. 3A, a portion of a package structure 100 is depicted in cross section, where the package structure 100 includes a package substrate 102. The package substrate 102 includes conductive substrate pads 104 on a surface 107 of the substrate 102, and a solder mask 103 adjacent the substrate pads 104. The substrate pads 104 comprise gold, and comprise at least 99.90 percent gold, in some embodiments. The substrate pad 104 may further comprise filler materials, such as but not limited to silicon and beryllium, for example. An opening 305 is between substrate pads 104, where the opening 305 is capable of accommodating the placement of a discrete component on the surface 107 of the substrate 102. Two substrate pads 104 are shown in FIG. 3A, however any number of substrate pads 104 may be on the surface 107 of the substrate 102.

Figure 3B:
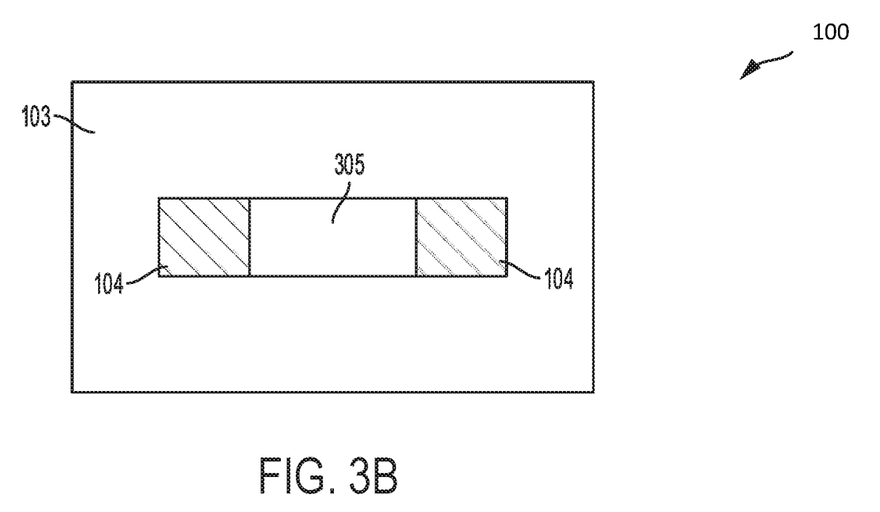

In FIG. 3B, a top view of a portion of the package structure 100 is shown. The substrate pads are adjacent the solder mask 103, and the solder mask 103 is also adjacent the opening 305. There may be a plurality of openings 305 on the substrate 102, In some embodiments, the openings 305 may be located in peripheral portions of the substrate 105, however in other embodiments, the openings 305 may be located in any desired location on the surface of the substrate 102.

Figure 3C:
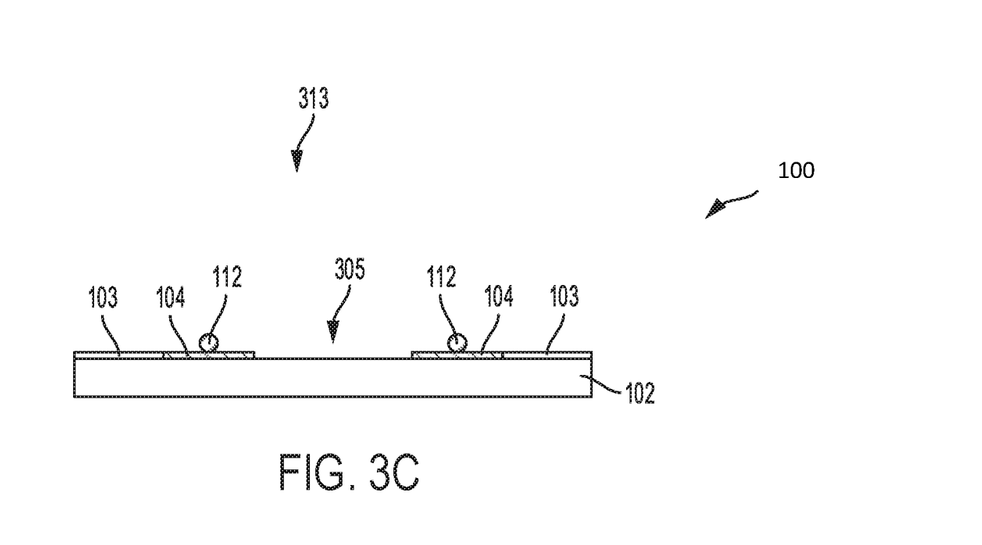

In FIG. 3C (cross-sectional view), at least one ball interconnect structure 112 may be placed onto the substrate pad 104. In some embodiments, the ball interconnect structure 112 may be placed onto the substrate pad 104 by using a wire bond process 313. For example, a wire comprising at least 99.90 percent gold, may be placed onto the substrate pad 104 using a wire bonding tool. The wire bonding process may then apply heat, and may apply an ultrasonic pressure. The spherical ball interconnect structures 112 thus formed may comprise diameters of between about 20 microns to about 100 microns, in some embodiments. The ball interconnect structures comprise greater than about 99.90 percent gold, and may additionally comprise filler materials, such as silicon and/or beryllium, for example.

Figure 3D:
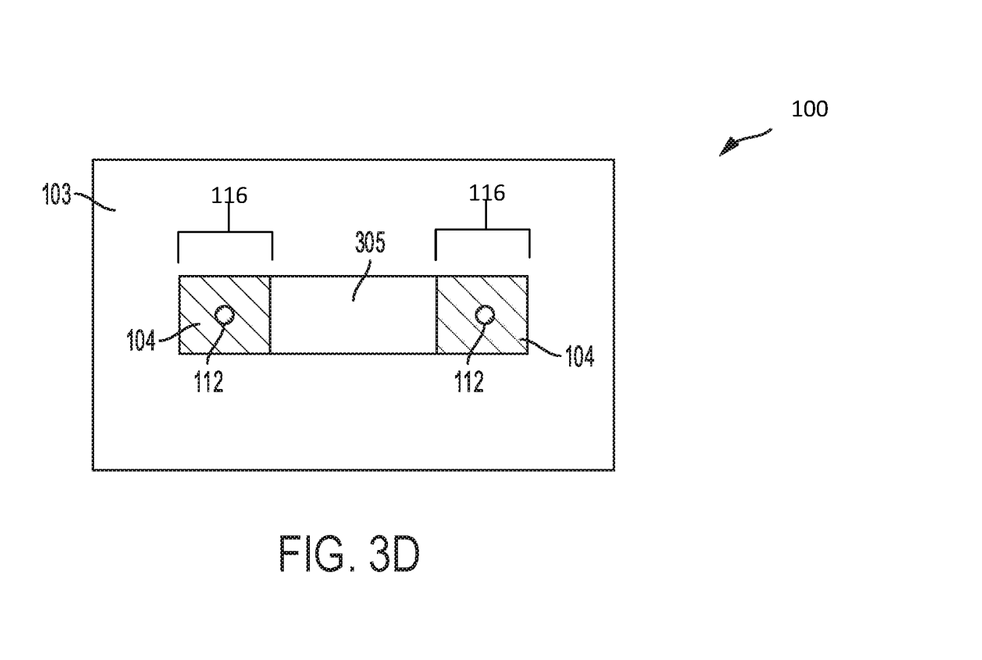
Figure 3E:
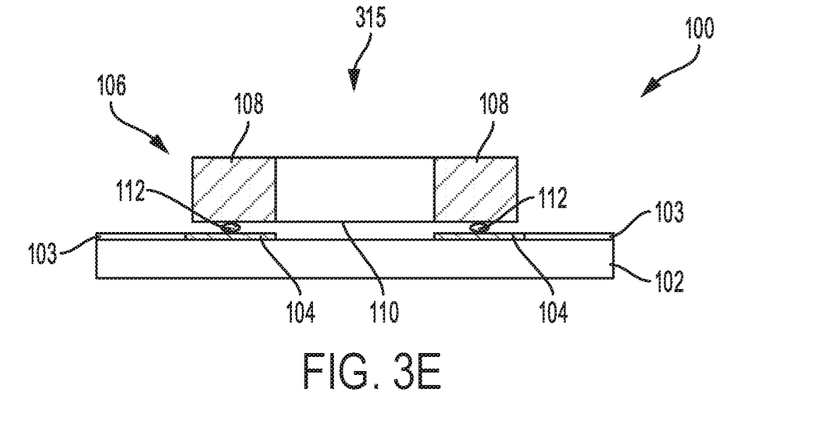

FIG. 3D depicts a cross-sectional view of ball interconnect structures 112 on the substrate pads 104. In some embodiments, more than one ball interconnect 112 may be placed on individual substrate pads 104, according to particular application requirements. The ball interconnect structures 112 are within the footprint 116 of the individual substrate pads 104, and do not extend beyond the substrate pad 104 footprint 116. FIG. 3E depicts a cross-sectional view of a discrete component 106 that has been placed on the substrate 102, using an attachment process 315. The attachment process 315 may include the application of heat and ultrasonic pressure, in some embodiments, and may employ a tool, such as a pick and place tool, with which to place the discrete component 106 onto the substrate 102. Each component terminal 108 of the discrete component 112 is placed on at least one ball interconnect structure 112, wherein the ball interconnect structure 112 is between the component terminal 108 and the substrate pad 104.

Figure 3F:
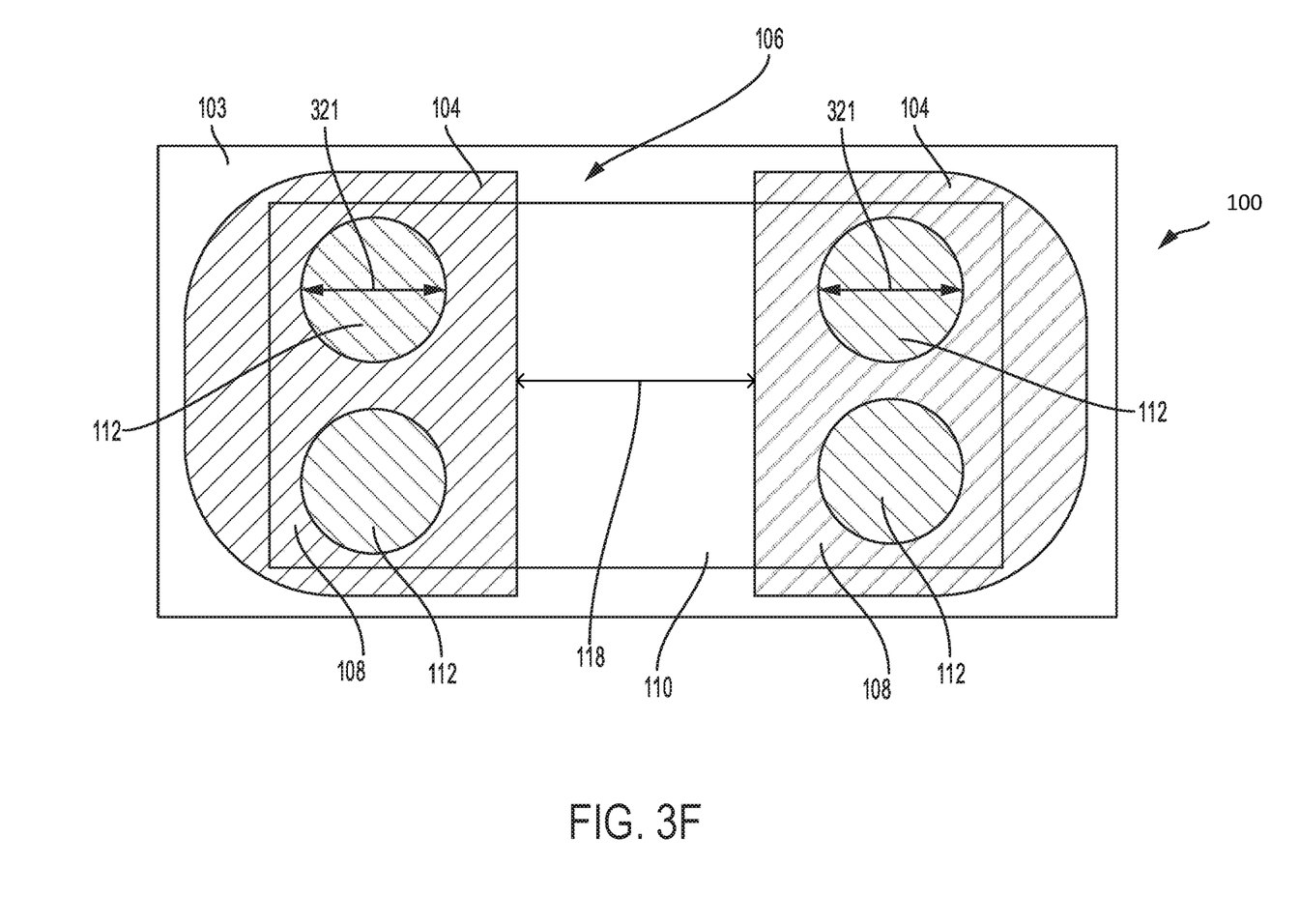

FIG. 3F depicts a top view of the package structure 100, wherein two ball interconnect structures 112 are on each substrate pad 104. The ball interconnect structures 112 may comprise a diameter 321 of between about 20 microns and about 100 microns, in some embodiments. The lateral width 118 of the component body 110 does not overlay the substrate pad 104, in some embodiments.

Figure 4A:
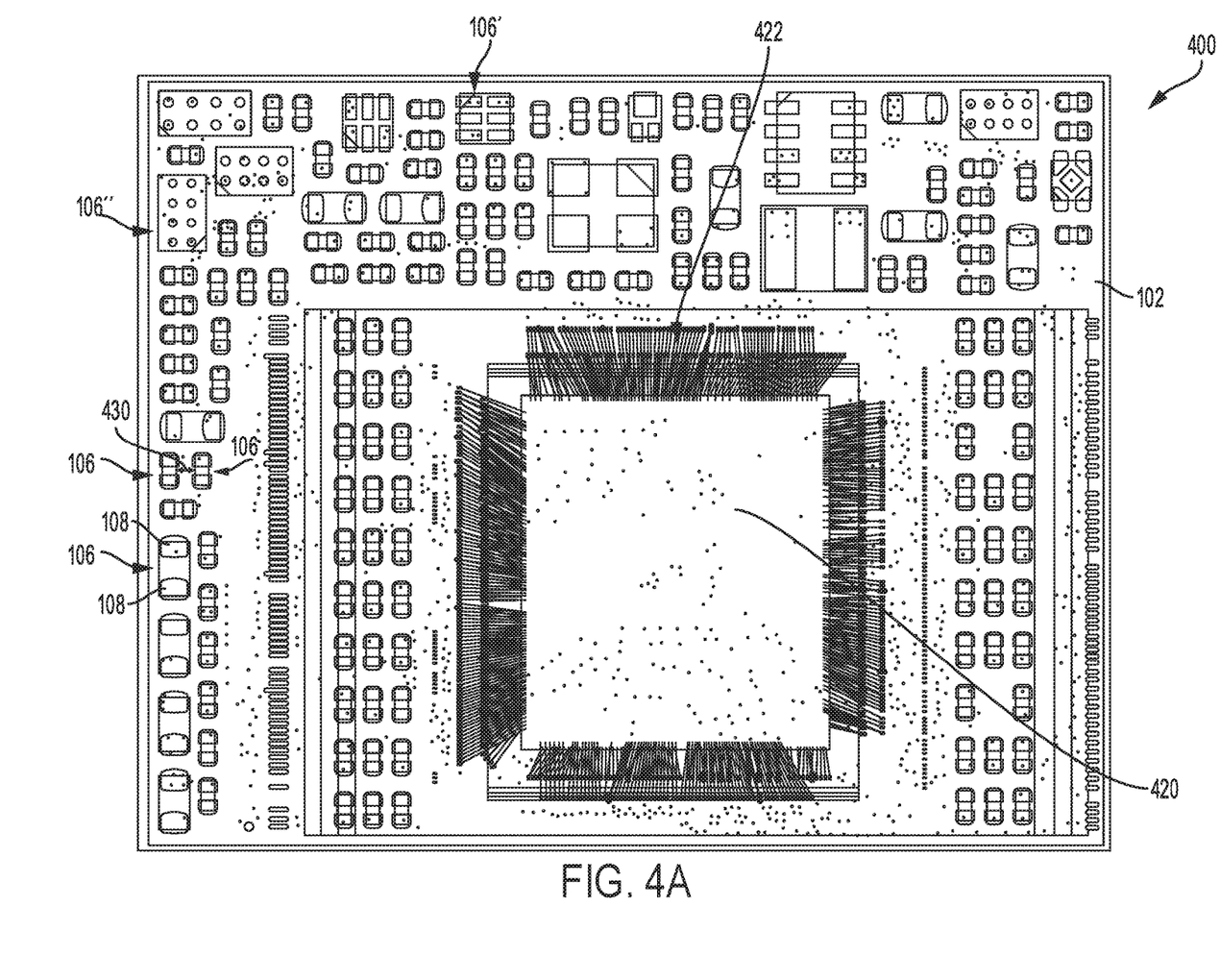
FIG. 4A illustrate top view of subtractive etch via structures, according to embodiments.

FIG. 4A depicts a top view of a package structure 400, wherein a substrate 102, such as a package substrate 102 for example, may comprise a plurality of discrete components 106 in peripheral regions of the substrate, in some embodiments. A die/device 420 may be on a central portion of the substrate, in some embodiments. In some embodiments, the die/device 420 may be attached/bonded to the substrate 102 by wire bonds 422, where the wire bonds may comprise any suitable conductive material, such as solder materials, for example.

In some embodiments, one or more die/devices 420 may be on the substrate 102, adjacent the discrete components 106, in any desired location on the substrate 102. The die/devices 420 may comprise any type of integrated device or integrated component that may be included within an electronic device package, such as an integrated circuit device, for example. In some embodiments, the die/device 420 includes a processing system (either single core or multi-core). In some embodiments, the die/device 420 may comprise a microprocessor, a graphics processor, a signal processor, a network processor, a chipset, a memory device etc. In some embodiments, the die/device 420 comprises a system-on-chip (SoC) having multiple functional units (e.g., one or more processing units, one or more graphics units, one or more communications units, one or more signal processing units, one or more security units, etc.).

In some other embodiments, the die/device 420 may be attached to the substrate 102 according to a variety of suitable configurations including a flip chip configuration, or any other suitable attachment configuration. In the flip chip configuration, active sides of the die/device 420 are attached to a first side of the substrate 102 using interconnect structures (not shown) such as bumps or pillars, which serve to route electrical signals, such as I/O, power and/or ground signals, associated with the operation of the die/device 420.

In some embodiments, the wire bonding or the flip chip connections may comprise conductive materials such as copper, gold and nickel. The substrate 102 may have discrete components 106 which comprise different numbers of component terminals. For example, discrete component 106 comprises two terminals, while discrete components 106', 106" comprise six and eight terminals, respectively. The substrate pads 104 may be formed to accommodate any number of discrete component terminals and/or any number of ball interconnect structures for a particular discrete component design. In some embodiments, a distance 430 between discrete components 106 may comprise less than 100 microns. In some embodiments, the distance 430 may comprise between about 25 microns and about 75 microns.

Figure 4B:
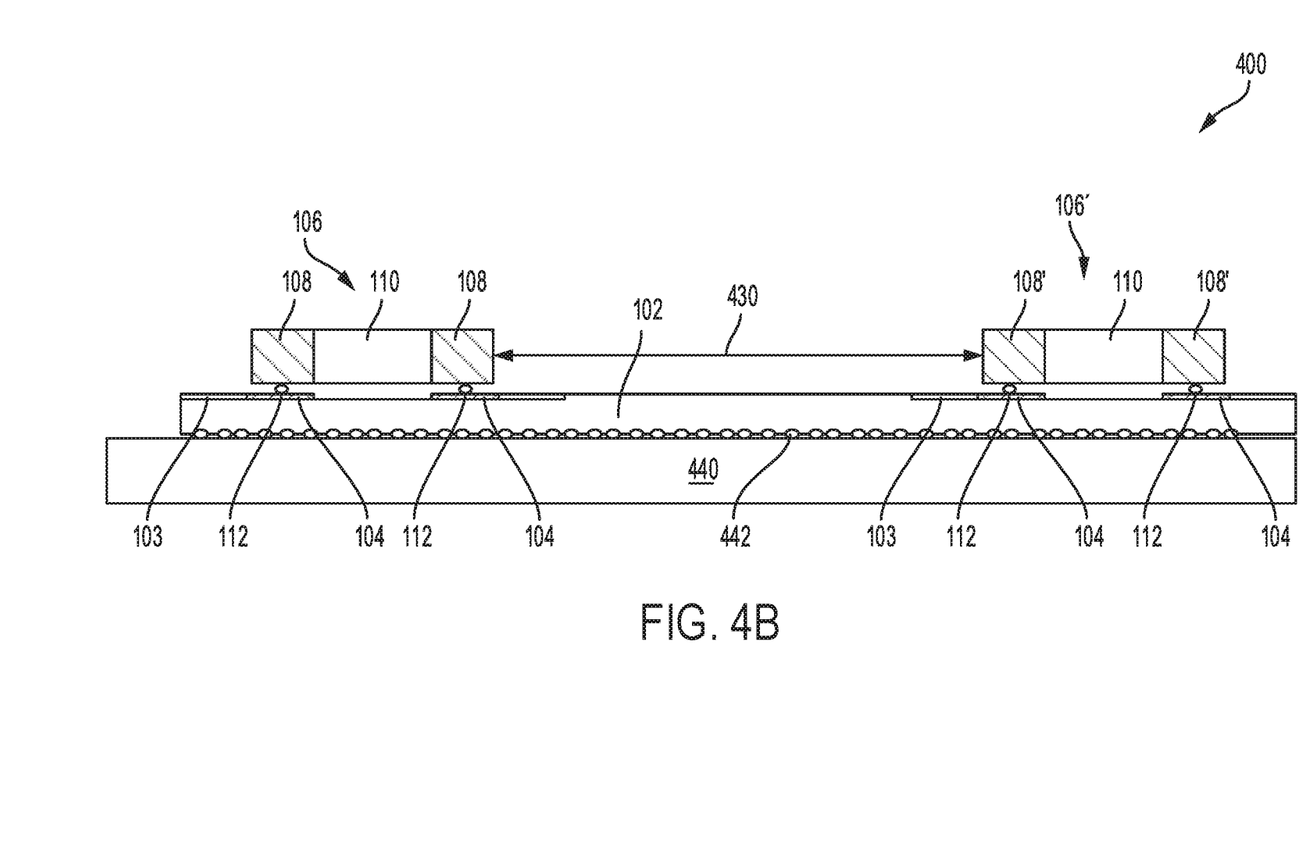
FIG. 4B illustrates a cross sectional view of a package structure with ball interconnect structures, according to embodiments.

FIG. 4B depicts a cross-sectional view of a portion of a package structure 400. Discrete components 106, 106' that are adjacent each other on the substrate 102 have a distance 430 between peripheral edges of the respective component terminals 108, 108'. In some embodiments the distance 430 is less than about 100 microns. In other embodiments, the distance 430 is between about 20 microns to about 75 microns. A bottom surface of the substrate 102 has solder interconnect structures 442 that couple to a board 440, such as a motherboard, for example.

Figure 5:
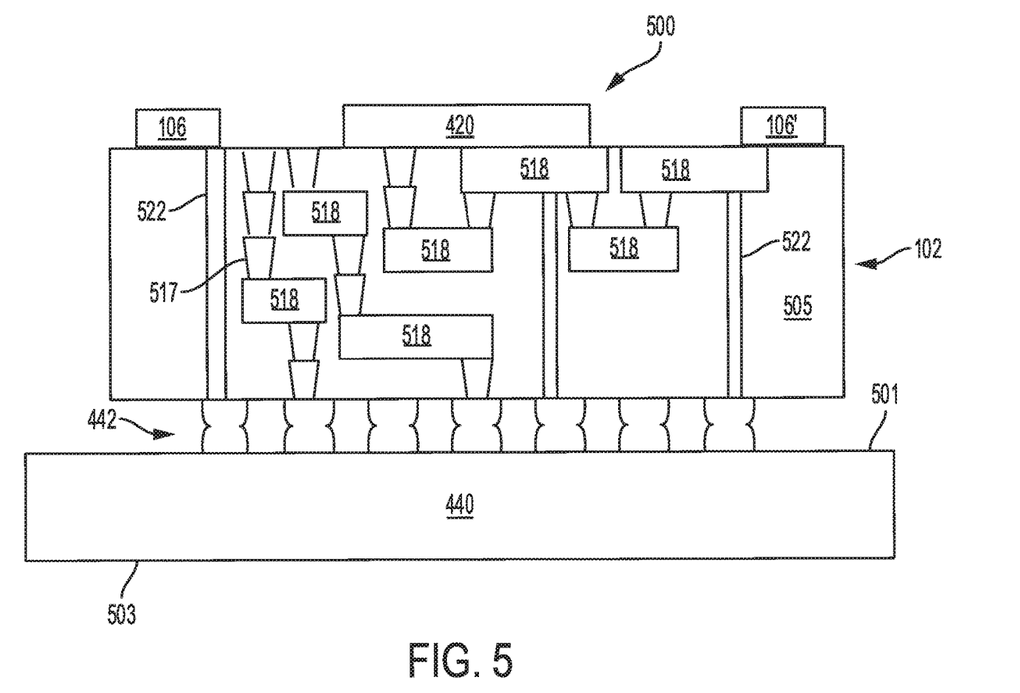
FIG. 5 is a cross-sectional view of a computing system employing packaging structures having ball interconnect structures, in accordance with embodiments.

Turning now to FIG. 5, illustrated is a cross sectional view of a computing system 500. The system 500 includes a board 440, such as a motherboard, or other circuit board. Board 440 includes a first side 501 and an opposing second side 503, and various components may be on either one or both of the first and second sides 501, 503, such as any of the embodiments of the discrete components comprising ball interconnect structures described herein. In some embodiments, the computing system 500 includes at least one device/die 420, where the die/device 420 may be on a surface of a substrate 102, which may comprise an interposer, or a system in package substrate, for example. Discrete components 106, 106' may be on the surface of the substrate 102, adjacent the die/device 420, and may be any of the embodiments of the discrete components described herein comprising the ball interconnect structure, such as those depicted in FIG. 1A, for example. Ball interconnect structures are between discrete component terminals and the substrate 102. Joint structures 442 may electrically and physically couple the package substrate 102 to the board 440.

System 400 may be any type of computing system, such as, for example, a hand-held or mobile computing device (e.g., a cell phone, a smart phone, a mobile internet device, a music player, a tablet computer, a laptop computer, a net top computer, etc.). However, the disclosed embodiments are not limited to hand-held and other mobile computing devices and these embodiments may find application in other types of computing systems, such as desk-top computers and servers.

In some embodiments, the substrate 102 may be any suitable type of circuit board or other substrate capable of providing electrical communication between one or more of the various components disposed on the substrate 102. In one embodiment, for example, the substrate 102 is a printed circuit board (PCB) comprising multiple metal layers 518 separated from one another by dielectric material 505, and interconnected by electrically conductive vias 517. The substrate may further comprise through vias 512 with which to route signals between the components on the surface of the substrate 102 and the board 440. Any one of the metal layers 518 may be formed in a desired circuit pattern to route—perhaps in conjunction with other metal layers—electrical signals between the discrete components 106, 106' and the die/device 420 coupled with the substrate 102. However, it should be understood that the disclosed embodiments are not limited to the above-described PCB and, further, that the substrate 102 may be any other suitable substrate.

Figure 6:
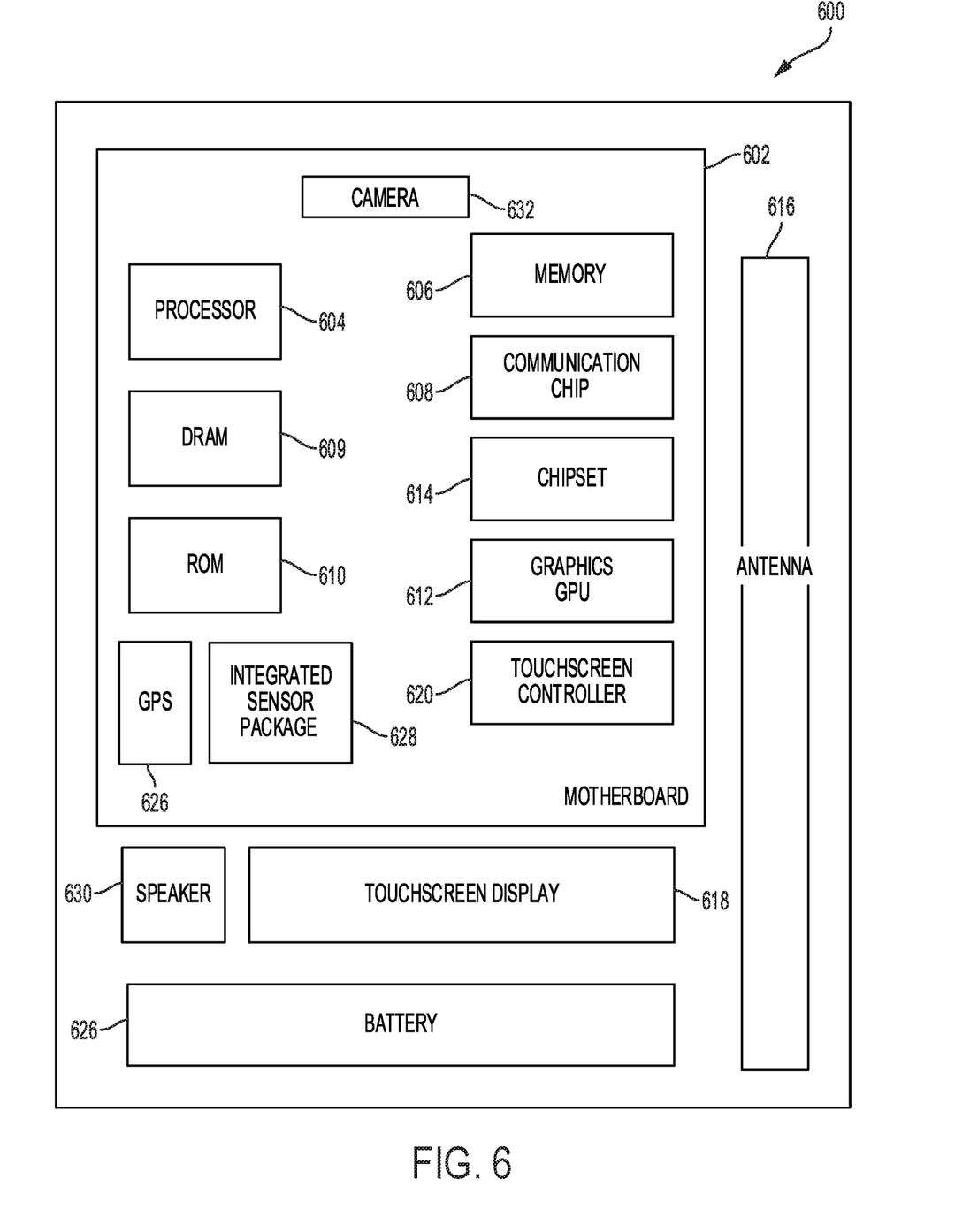
FIG. 6 is a functional block diagram of employing packaging structures having ball interconnect structures, in accordance with embodiments.

FIG. 6 is a schematic of a computing device 600 that may be implemented incorporating the package structures described in any of the embodiments herein comprising discrete components with ball interconnect structures on a substrate, such as those depicted in FIG. 1A, for example. In an embodiment, the computing device 600 houses a board 602, such as a motherboard 602 for example. The board 602 may include a number of components, including but not limited to a processor 604, an on-die memory 606, and at least one communication chip 608. The processor 604 may be physically and electrically coupled to the board 602. In some implementations the at least one communication chip 608 may be physically and electrically coupled to the board 602. In further implementations, the communication chip 608 is part of the processor 604.

Depending on its applications, computing device 600 may include other components that may or may not be physically and electrically coupled to the board 602, and may or may not be communicatively coupled to each other. These other components include, but are not limited to, volatile memory (e.g., DRAM) 609, non-volatile memory (e.g., ROM) 610, flash memory (not shown), a graphics processor unit (GPU) 612, a chipset 614, an antenna 616, a display 618 such as a touchscreen display, a touchscreen controller 620, a battery 622, an audio codec (not shown), a video codec (not shown), a global positioning system (GPS) device 626, an integrated sensor 628, a speaker 630, a camera 632, an amplifier (not shown), compact disk (CD) (not shown), digital versatile disk (DVD) (not shown), and so forth). These components may be connected to the system board 602, mounted to the system board, or combined with any of the other components.

The communication chip 608 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 600 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A microelectronic package structure comprising:
   a substrate;
   a substrate pad on a first side of the package substrate, wherein the substrate pad comprises a beryllium filler material;
   an at least partially spherical ball interconnect structure, wherein the ball interconnect structure is on the substrate pad, wherein the ball interconnect structure comprises at least 99.0 percent gold, and wherein the ball interconnect structure comprises the beryllium filler material; and
   a discrete component, wherein the discrete component comprises a component terminal and a component body, wherein a footprint of the ball interconnect structure is within a footprint of the component terminal, and wherein the component terminal is on the ball interconnect structure, and wherein a lateral width of the substrate pad does not extend into a footprint of the component body.

2. The microelectronic package structure of claim 1, wherein the substrate pad is on a peripheral portion of the substrate, and wherein the substrate pad comprises at least 99.0 percent gold.

3. The microelectronic package structure of claim 1, wherein a diameter of the ball interconnect structure comprises between 20 microns to 100 microns.

4. The microelectronic package structure of claim 1, wherein the discrete component comprises:
   a first component terminal and a second component terminal;
   a first ball interconnect structure between the first component terminal and a first substrate pad; and
   a second ball interconnect structure between the second component terminal and a second substrate pad;
   wherein a footprint of the first substrate pad is less than 10 percent greater than a footprint of the first component terminal, and wherein a footprint of the second substrate pad is less than 10 percent greater than a footprint of the second component terminal.

5. The microelectronic package structure of claim 4, wherein the discrete component comprises a first discrete component, and further comprising a second discrete component adjacent the first discrete component, wherein a space between the first discrete component and the second discrete component is 20 microns to 100 microns.

6. The microelectronic package structure of claim 4, wherein a footprint of the discrete component body is between the footprint of the first substrate pad and the footprint of the second substrate pad.

7. The microelectronic package structure of claim 1, wherein the discrete component comprises a surface mount component, and wherein the substrate comprises a system in package substrate.

8. The microelectronic package structure of claim 1, wherein a footprint of the component terminal is within 10 percent of a footprint of the substrate pad.

9. The microelectronic package structure of claim 1, wherein a die is on the first side of the substrate, and wherein a plurality of the discrete components is adjacent to the die.

10. A microelectronic package structure comprising:
   a substrate, wherein the substrate comprises a first side and a second side;
   one or more substrate pads on the first side of the substrate, wherein the one or more substrate pads comprise a beryllium filler material, and wherein the one or more substrate pads comprise at least 99.0 percent gold;
   a die on the first side of the substrate, wherein the die is on a central portion of the substrate;
   a first discrete component on the first side of the substrate, wherein the first discrete component comprises two or more component terminals, the component terminals on a first side of the first discrete component;
   a first ball interconnect structure between a first discrete component terminal of the first discrete component and a first substrate pad, wherein the footprint of the first ball interconnect structure is within a footprint of the first discrete component terminal;
   a second discrete component adjacent the first discrete component, wherein the second discrete component comprises two or more component terminals, the component terminals on a first surface of the second discrete component; and
   a second ball interconnect structure between a first component terminal of the second discrete component and a second substrate pad, wherein the footprint of the second ball interconnect structure is within a footprint of the second discrete component terminal, wherein at least one of the first ball interconnect structure or the second ball interconnect structure comprise the beryllium filler material, and wherein the first and second ball interconnect structures are at least partially spherical, and wherein the first and second ball interconnect structures comprise at least 99.0 percent gold.

11. The microelectronic package structure of claim 10, wherein the first discrete component and the second discrete component are on a peripheral portion of the first side of the substrate.

12. The microelectronic package structure of claim 10, wherein the first component comprises a surface mount component, and wherein the substrate comprises a system in package substrate, and wherein the surface mount component is electrically coupled to the system in package substrate by the first ball interconnect structure.

13. The microelectronic package structure of claim 10, wherein at least one of the first discrete component or the second discrete component comprises multiple component terminals, wherein individual ones of the multiple component terminals have at least one ball interconnect structure between the individual ones of the component terminals and a substrate pad.

14. The microelectronic package structure of claim 10, wherein the first discrete component and the second discrete component are separated by a distance, wherein the distance is between 25 microns and 100 microns.

15. A method of fabricating a microelectronic structure, comprising:
   forming a substrate pad on a surface of a substrate, wherein the substrate pad comprises a beryllium filler material;
   forming an at least partially spherical ball interconnect structure on the substrate pad, wherein the ball interconnect structure comprises at least 99.0 percent gold, wherein the ball interconnect structure comprises the beryllium filler material;
   attaching a surface mount component to the ball interconnect structure, wherein a component terminal of the surface mount component is on the ball interconnect structure, wherein a footprint of the ball interconnect structure is within a footprint of the first discrete component terminal, and wherein a lateral width of the substrate pad does not extend into a footprint of the component body.

16. The method of fabricating the microelectronic structure of claim 15, wherein forming the ball interconnect structure comprises attaching the ball interconnect structure onto the substrate pad by using heat and ultrasound.

17. The method of fabricating the microelectronic structure of claim 15, further comprising attaching a die on the substrate adjacent the surface mount component.

18. The method of fabricating the microelectronic structure of claim 15, wherein attaching the surface mount component comprises heating and applying an ultrasonic process to the surface mount component to attach the surface mount component to the substrate pad.

19. The method of fabricating the microelectronic structure of claim 15, wherein forming the substrate pad comprises forming a substrate pad comprising at least 99.0 percent gold.

20. The method of fabricating the microelectronic structure claim 15, wherein attaching the surface mount component comprises attaching the component terminal within a footprint of the substrate pad.

* * * * *